United States Patent
Rosenstein et al.

(10) Patent No.: US 6,228,236 B1
(45) Date of Patent: May 8, 2001

(54) SPUTTER MAGNETRON HAVING TWO ROTATION DIAMETERS

(75) Inventors: Michael Rosenstein, Sunnyvale; Jianming Fu, San Jose; Leif Eric Delaurentis, Boulder Creek; James van Gogh, Sunnyvale; Alan Liu, Mountain View, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/422,897

(22) Filed: Oct. 22, 1999

(51) Int. Cl.$^7$ .................................................. C23C 14/35
(52) U.S. Cl. .................. 204/298.2; 204/298.19; 204/298.21; 204/298.22; 204/298.27; 204/298.28; 204/298.09; 204/298.37; 204/192.12; 204/192.32; 134/1.1; 134/1.2; 315/39.51; 315/39.63; 315/39.57
(58) Field of Search ............................ 204/298.2, 298.19, 204/298.21, 298.22, 298.27, 298.28, 298.09, 298.37, 192.12, 192.32; 134/1.1, 1.2; 315/39.51, 39.63, 39.57

(56) References Cited

U.S. PATENT DOCUMENTS

| 4,714,536 | * | 12/1987 | Freeman et al. ................. 204/192.12 |
| 5,188,717 | * | 2/1993 | Broadbent et al. ............. 204/192.12 |
| 6,013,159 | * | 1/2000 | Adams et al. ................... 204/192.12 |

* cited by examiner

Primary Examiner—Alan Diamond
(74) Attorney, Agent, or Firm—Charles S. Guenzer

(57) ABSTRACT

A magnetron for use in a DC magnetron sputtering reactor that can rotate at a smaller diameter during a deposition phase and at a larger diameter during a cleaning phase, whereby sputter material redeposited outside of the deposition sputtering track is removed during the cleaning phase. An embodiment for a two-diameter magnetron includes a swing arm fixed on one end to the magnetron rotation motor shaft and on the other end to a pivot shaft, pivotably coupled to the magnetron. When the magnetron is rotated in different directions, hydrodynamic forces between the magnetron and the chilling water bath cause magnetron to pivot about the pivot shaft. Two mechanical detents fix the limits of the pivoting and hence establish the two diameters of rotation.

19 Claims, 4 Drawing Sheets

SPUTTER MAGNETRON HAVING TWO ROTATION DIAMETERS

FIELD OF THE INVENTION

The invention relates generally to the deposition of materials by sputtering. In particular, the invention relates to a magnetron creating a magnetic field to enhance sputtering.

BACKGROUND ART

The fabrication of modern semiconductor integrated circuits requires the deposition and patterning of multiple levels of metallization interconnecting together the active semiconductor devices in the silicon or other semiconductor substrate and also connecting the devices to external electrical lines. Typically, a layer of dielectric, such as a silica-based material, is deposited. Photolithography is then used to pattern into the dielectric a series of vertically extending contact or via holes and possibly other interconnecting structures. Hereafter, only via holes will be referred to although most of the discussion is equally applicable to contact holes and other metallization structures formed in the dielectric. An interconnect metal, such as aluminum, is then filled into the holes and over the top of the dielectric layer. In the past, the horizontal interconnects have been typically etched by a metal etching process. However, more recently, a damascene process has been developed. Prior to the metal deposition, the horizontal interconnect pattern is etched into the dielectric in the form of trenches. The metal is then deposited into the vias, the trenches, and over the top of the dielectric. Chemical mechanical polishing removes any metal above the top of the trenches. Also, more recently, low-k dielectrics have been developed to replace the silicon dioxide or silicate glass dielectric, and process have been developed to replace aluminum with copper as the metallization.

Sputtering, also called physical vapor deposition (PVD), has been the favored technique for depositing metals. Sputtering is relatively fast, sputtering equipment and materials are relatively inexpensive, and the equipment is more reliable compared to that for chemical vapor deposition (CVD). Techniques have been recently developed to electroplate copper into deep via holes. However, electroplated copper like most other metallizations deposited over silicate-based dielectrics requires one or more thin layers to be first deposited on the sides and bottom of the via hole as an adhesion layer, a seed layer for subsequent deposition, and as a barrier layer preventing atomic migration between the metal and the dielectric. These barrier and other layers are typically composed of Ti/TiN for aluminum metallization and of Ta/TaN for copper metallization, but other materials are possible. Sputtering is still preferred for at least some of these initial layers deposited over the dielectric.

Advanced semiconductor integrated circuits structures are densely packed, and vias have an increasingly large aspect ratio, which is the ratio of the depth to the minimum width of the hole being coated or filled. Aspect ratios of above four are being required. Conventional sputtering, however, is poorly suited for conformal deposition into holes having such high aspect ratios because conventional sputtering produces an angularly wide distribution of sputtered particles which therefore have a low probability of reaching the bottom of a deep and narrow via hole.

Nonetheless, sputtering equipment and techniques have been developed that better provide for filling high aspect-ratio vias. In one approach, referred to as ionized metal plasma (IMP) sputtering, an RF coil couples additional energy into the sputtering plasma to create a high-density plasma (HDP). This approach, however, suffers from high equipment cost.

Another approach, often referred to as self-ionized plasma (SIP) sputtering, uses modified DC magnetron sputtering apparatus to achieve many of the effects of IMP sputtering and in some situations has been observed to deposit better films. The equipment developed for SIP sputtering is also usable for sustained self-sputtering (SSS) of copper, in which no argon working gas is required, as will be explained later.

A conventional PVD reactor 10, with a few modifications for SSS or SIP sputtering, is illustrated schematically in cross section in FIG. 1. The illustration is based upon the Endura PVD Reactor available from Applied Materials, Inc. of Santa Clara, Calif. The reactor 10 includes a vacuum chamber 12 sealed through a ceramic isolator 14 to a PVD target 16 composed of the material, usually a metal, to be sputter deposited on a wafer 18 held on a heater pedestal electrode 20 by a wafer clamp 22. Alternatively to the wafer clamp 22, an electrostatic chuck may be incorporated into the pedestal 20 or the wafer may be placed on the pedestal 20 without being held in place. The target material may be aluminum, copper, aluminum, titanium, tantalum, alloys of these metals containing a few percentages of an alloying element, or other metals amenable to DC sputtering. A shield 24 held within the chamber protects the chamber wall 12 from the sputtered material and provides the anode grounding plane. A selectable and controllable DC power supply 26 negatively biases the target 14 to about −600V DC with respect to the shield 24. Conventionally, the pedestal 20 and hence the wafer 18 are left electrically floating, but for some types of SSS and SIP sputtering, an RF power supply 28 is coupled to the pedestal 18 through an AC coupling capacitor 30 or more complex matching and isolation circuitry to allow the pedestal electrode 20 to develop a DC self-bias voltage, which attracts deep into a high aspect-ratio holes positively charged sputter ions created in a high-density plasma. Even when the pedestal 20 is left electrically floating, it develops some DC self-bias.

A first gas source 34 supplies a sputtering working gas, typically argon, to the chamber 12 through a mass flow controller 36. In reactive metallic nitride sputtering, for example, of titanium nitride or tantalum nitride, nitrogen is supplied from another gas source 38 through its own mass flow controller 40. Oxygen can also be supplied to produce oxides such as $Al_2O_3$. The gases can be admitted from various positions within the chamber 12 including from near the bottom, as illustrated, with one or more inlet pipes supplying gas at the back of the shield 24. The gas penetrates through an aperture at the bottom of the shield 24 or through a gap 42 formed between the wafer clamp 22 and the shield 24 and the pedestal 20. A vacuum system 44 connected to the chamber 12 through a wide pumping port 46 maintains the interior of the chamber 12 at a low pressure. Although the base pressure can be held to about $10^{-7}$ Torr or even lower, the conventional pressure of the argon working gas is typically maintained at between about 1 and 1000 mTorr. However, for semi-ionized sputtering, the pressure may be somewhat lower, for example, down to 0.1 mTorr. For SSS sputtering, once the plasma has been ignited, the supply of argon may be stopped, and the chamber pressure may be made very low. A computer-based controller 48 controls the reactor including the DC power supply 26 and the mass flow controllers 36, 40.

When the argon is admitted into the chamber, the DC voltage between the target 16 and the shield 24 ignites the argon into a plasma, and the positively charged argon ions are attracted to the negatively biased target 16. The ions strike the target 16 at a substantial energy and cause target atoms or atomic clusters to be sputtered from the target 16. Some of the target particles strike the wafer 18 and are thereby deposited on it, thereby forming a film of the target material. In reactive sputtering of a metallic nitride, nitrogen is additionally admitted into the chamber 12, and it reacts with the sputtered metallic atoms to form a metallic nitride on the wafer 18.

To provide efficient sputtering, a magnetron 50 is positioned in back of the target 16. It has opposed magnets 52, 54 coupled by a magnetic yoke 56 producing a magnetic field within the chamber in the neighborhood of the magnets 52, 54. The magnetic field traps electrons and, for charge neutrality, the ion density also increases to form a high-density plasma region 58 within the chamber adjacent to the magnetron 50. To achieve full coverage in sputtering of the target 16, the magnetron 50 is usually rotated about the center 60 of the target 16 by a shaft 62 driven by a motor 64. Typical rotation speeds are 80 to 95 rpm. In a conventional magnetron, an axis 57 fixed with respect to the magnets 52, 54 is coincident with the target center 60, and the magnetron 50 sweeps a constant track about the target center 60.

Fu in U.S. patent application, Ser. No. 09/373,097, filed Aug. 12, 1999 discloses several designs of a magnetron useful for SSS and SIP. The magnetron should produce a strong magnetic field and have a small area. The rotation can nonetheless provide full target coverage. The magnetron should include an inner pole associated with inner magnets 52 surrounded by a continuous outer pole of the opposite polarity associated with the outer magnets 54. The inner and outer poles are asymmetric in that the total magnetic flux produced by the outer pole is substantially greater than that produced by the inner pole. Thereby, magnetic field lines extend deep into the chamber towards the wafer 16. The illustrated magnet distribution is intended to be only suggestive, and the patent to Fu should be consulted for a full understanding. The power supplied by the DC supply 26 to the target 16 should be large, of the order of 20 kW for a 200 mm wafer. The combination of high power and small magnetron area produces a very high power density beneath the magnetron 50 and hence a moderately high-density plasma area 58 without the use of supplemental plasma source power, such as would be provided by RF inductive coils.

To counteract the large amount of power delivered to the target, the back of the target 16 may be sealed to a back chamber 66. Chilled water is circulated through the interior 68 of the back chamber 66 to cool the target 16. The magnetron 50 is typically immersed in the cooling water 68, and the target rotation shaft 62 passes through the back chamber 66 through a rotary seal 70.

Full coverage of the target by the magnetron is required not only for uniformity and target utilization, but also to not leave any effective portion of the target unsputtered. Sputtering, in fact, is a partially balanced process in which some of sputtered material (aluminum or copper, for example) is redeposited on the target. The sputtered material redeposited in the track of the rotating magnetron does not present a problem since it will be subsequently resputtered, thereby always exposing some fresh target material. However, if the sputtered material is redeposited outside the area scanned by the magnetron (adjusted for the effective extent of the high-density plasma region 58), the redeposited sputtered material builds up on top of the target surface. The redeposited film may grow to sufficient thickness that it flakes off, particularly in view of temperature cycling, thereby producing particles within the chamber. Such particles are likely to settle on the wafer being processed. Particle production is a major problem in the fabrication of dense integrated circuit. A single particle of size approximately equal to or larger than the minimum feature size that falls on an integrated circuit die may cause that integrated circuit to either fail on initial test or to introduce a reliability problem after the integrated circuit has been sold and installed in a system. The redeposition problem is particularly acute in the reactive sputtering of, for example, titanium nitride and tantalum nitride. The sputtered titanium or tantalum is likely to redeposit in their nitride forms. The nitride material is more likely to flake off. They quickly build up closely adjacent the magnetron track, and the area of greatest contamination occurs near the outermost edge of the track. Since the nitride layers are insulating, a nitrided target surface can further cause localized electrical abnormalities on the target surface, which can lead to ejection from the target of larger portions of the target, the sputtered particles having diameters of up to about a millimeter, called splats. Even if the metal is redeposited in relatively pure form, it may have an undesirable crystalline properties affecting the sputtering process.

The redeposition problem is more difficult to handle with SIP or SSS sputtering than with conventional or IMP sputtering. In conventional and IMP sputtering, the magnetron strength and DC power density are lower leading to less build up of redeposited material. However, to achieve the high target power densities required for SIP or SSS in a substantially conventional DC magnetron reactors, the size of the magnet strength must be focused to a smaller area. As a result, in SIP or SSS practiced in the types of chamber such as shown in FIG. 1, the sputtering of regions outside of a diameter somewhat greater than which through which the magnetron is swept may be at such a low rate that redeposited materials are more likely to build up on the target outside the magnetron track.

Accordingly, it is desired to prevent the buildup of sputter material redeposited on the sputtering target.

SUMMARY OF THE INVENTION

The invention may be summarized as a rotatable magnetron that can operate with different diameters of rotation, preferably two diameters.

In one use of the invention, sputtering of production devices is performed with the magnetron configured to its smaller diameter, and the target is cleaned with the magnetron configured to its larger diameter.

During the cleaning phase, the sputtering conditions of the reactor may be set to the same as for depositing phase, or the sputtering conditions may be changed.

According to one aspect of the invention, the magnetron assumes one diameter when it is rotated in one direction and assumes another diameter when it is rotated in the opposite direction.

Preferably, any production wafer is removed from the chamber during cleaning, but a dummy wafer is inserted to protect the wafer pedestal.

DETAILED DESCRIPTION OF THE PREFERRED EMBODIMENTS

Figure 1:
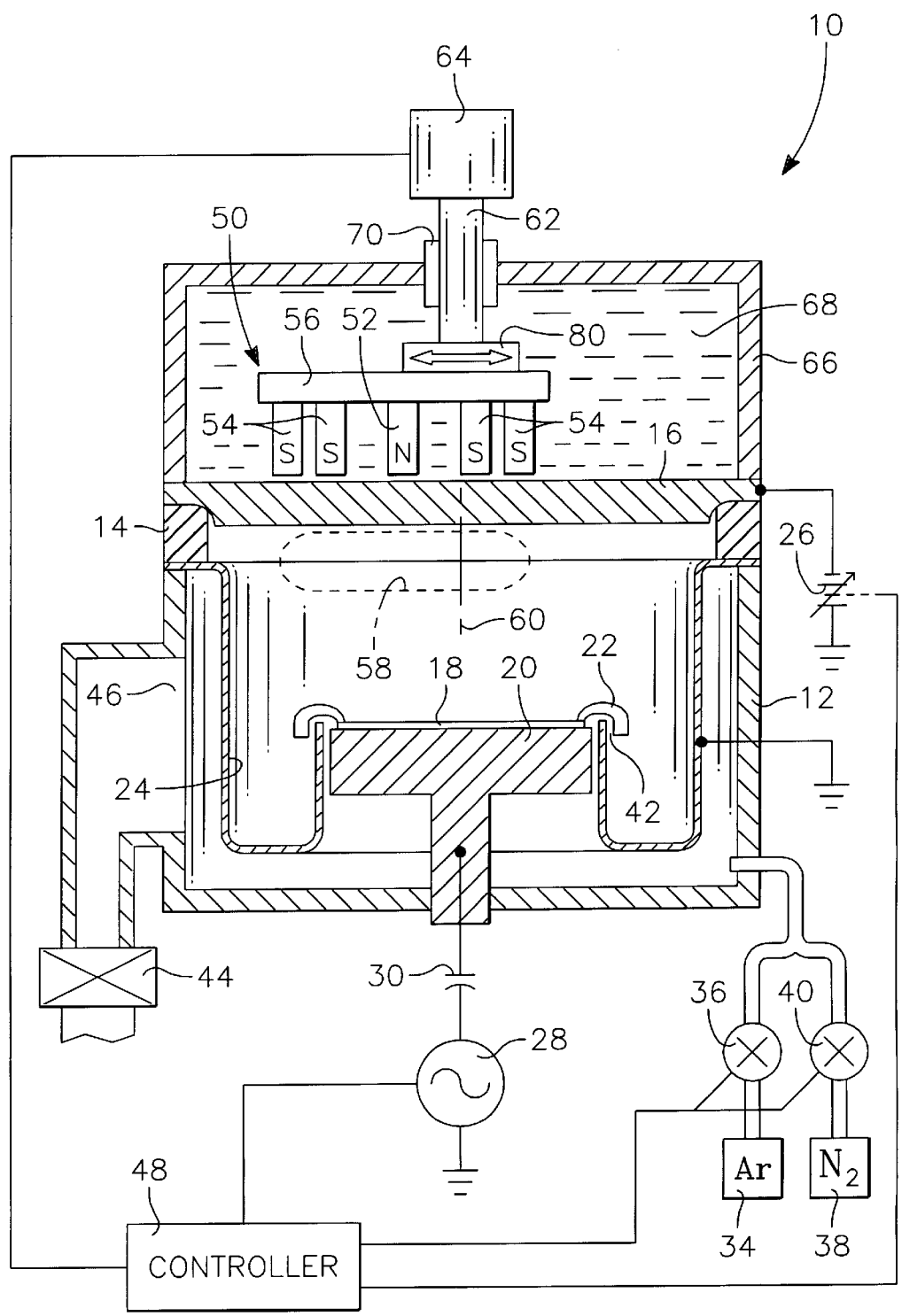
FIG. 1 is a schematic representation of a DC magnetron sputter reactor usable for conventional DC magnetron sputtering, semi-ionized metal plasma sputtering, or sustained self-sputtering.

According to one embodiment of the invention, an eccentric mechanism 80 is interposed between the rotation shaft 62 and the magnetron 50 so that the magnetron 50 can be made to rotate about two different points in the distribution of magnets 52, 54. Thereby, the diameter of the track swept by the magnetron 50 is adjustable. The smaller diameter is used during sputter deposition of production wafers and produces the usual erosion pattern observed in sputtering. The larger diameter is used to clean the target 14 not only in the area of the usual target erosion pattern but in an annular area radially outside of the erosion pattern. Thereby, any sputter material redeposited in the annular area is sputtered away before it builds up to a thickness that would cause flaking.

Figure 2:
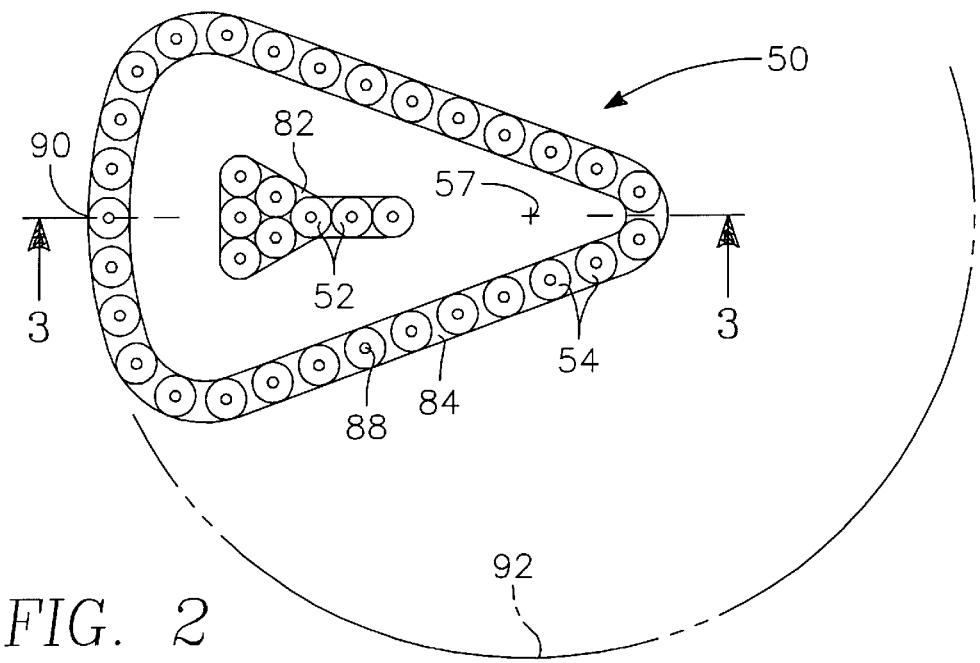
FIG. 2 is a plan diagram of a distribution of magnets in a magnetron usable with the invention.
Figure 3:
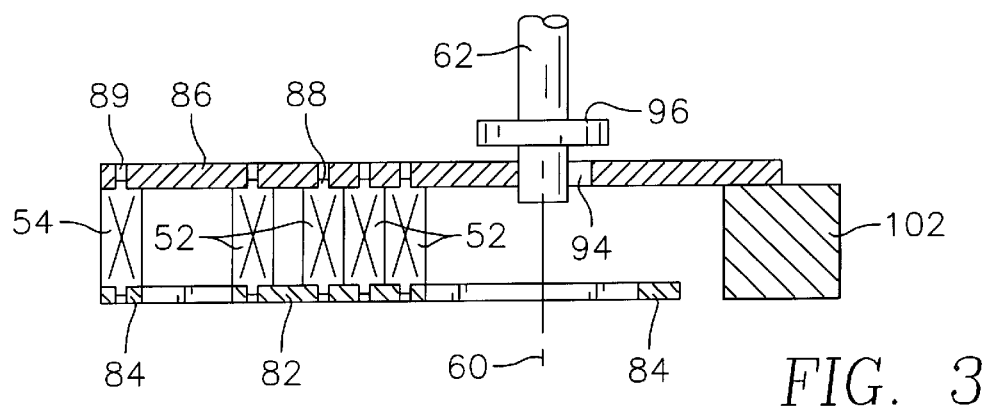
FIG. 3 is a cross-sectional view of a magnetron taken along view line 3—3 of FIG. 2.

An example of the magnet distribution of the inner and outer magnets 52, 54 is shown in plan view in FIG. 2 and in cross-sectional view in FIG. 3 taken along view line 3—3 of FIG. 2. Because of the precise distribution of outer magnets 54, no outer magnet 54 is shown on the right side of the cross-sectional view. The inner magnets 52 of one magnetic polarity are fixed at the their lower ends to a inner pole face 82 of a magnetically permeable material. Similarly, the outer magnets 54 of the other magnetic polarity are fixed at their lower ends to an outer pole face 84 of the magnetically permeable material. The pole faces 82, 84 have shapes and areas corresponding to the distribution of the respective magnets 52, 54. The upper ends of all the magnets are fixed to a single magnetic yoke 86 of a magnetically permeable material, which magnetically couples the magnets 52, 54 of opposed polarities. The plan view of FIG. 2 is taken below the magnetic yoke 86 and thus does not show it.

The magnets 52, 54 have tabs 88 on each of their two axial ends, which are captured by respective holes 89 in the pole faces 82, 84 and yoke 86. Unillustrated screws provide mechanical rigidity between the pole faces 82, 84 and yoke 86. The magnets 52, 54 are magnetized along their axial directions (vertically in FIG. 3). They may be of identical size and composition with their individual magnetic polarity determined by which end is fixed to the pole faces 82, 84. However, it is sometimes advantageous to vary the strength of the magnets by varying their diameter or composition in order to increase or otherwise vary the sputtering uniformity of the target.

In the deposition position illustrated in FIGS. 2 and 3, the outer end 90 of the magnetron 50 traces a first circle 92 of a first diameter. For a 200 mm wafer, the first diameter may be about 350 mm so that a more uniform sputter deposition on the wafer is achieved.

Figure 4:
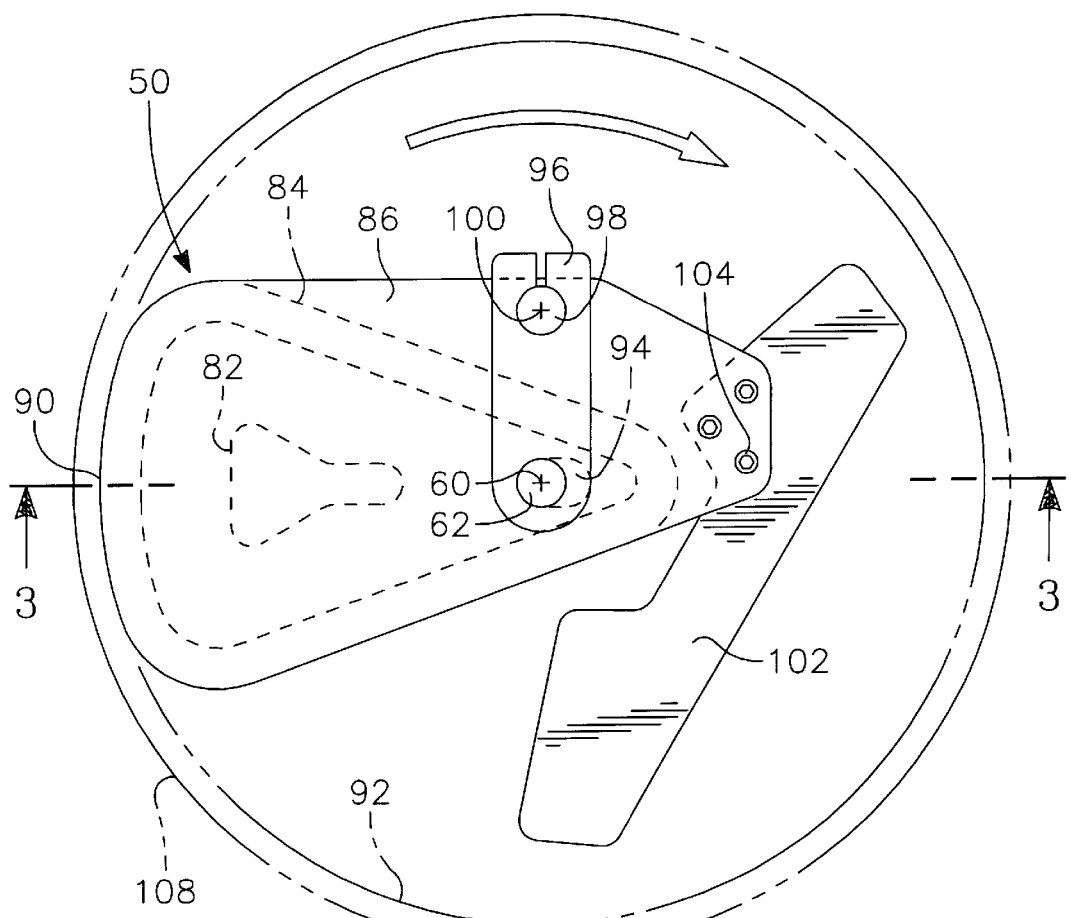
FIG. 4 is a plan view of an embodiment of a dual-diameter magnetron of the invention in the deposition position and corresponds to the cross-sectional view of FIG. 3.

The magnetic yoke 86 also serves as a mechanical support plate. In the conventional magnetron of fixed rotation diameter, the yoke 86 is fixed to the rotation shaft 62 with its rotation axis 60 aligned with the center 57 of the target. However, in this embodiment, as illustrated in the cross-sectional view of FIG. 3 taken along view line 3—3 and in the plan view of FIG. 4, the motor rotation shaft 62 freely but closely passes through a radially extending hole or slot 94 in the yoke 86 and extends slightly below the bottom of the yoke 86. The motor shaft 62, rather than being fixed to the yoke 86, is instead fixed to a swing arm 96. The other end of the swing arm 96 is fixed to one axial end of an axial pivot joint 98. The other axial end of the pivot joint 98 is fixed to the magnetic yoke 86. The two ends of the axial pivot joint 98 are free to rotate in different azimuthal directions so that the magnetic yoke 86 freely pivots with respect to the swing arm 98 about an axis 100 of the pivot joint 98 offset from the target center 60. The axial pivot joint 98 must operate in the cooling water 68 and present low friction. An example of such an axial pivot joint is a Free-Flex Pivot commercially available from Lucas Aerospace of Utica, N.Y. as part number 5032-800.

A counterweight 102 of non-magnetic material is fixed to the magnetic yoke 86 by three screws 104 to balance the shaft torque as the magnetron 50 and counterweight 102 are continuously rotated by the motor shaft 62 about the target center.

During deposition, the motor 64 and attached motor shaft 62 rotate the magnetron 50 and counterweight 102 in the clockwise direction in the chilling water bath 68 as viewed from above. Because of the large off-axis area presented by the magnetron 50 and counterweight 102, the water bath 68 produces a significant counter-clockwise force about the pivot center 100. This hydrodynamic force causes the yoke 86 and attached magnetron 50 and counterweight 102 to rotate counter-clockwise until the counter-clockwise (left as illustrated) edge of the elongated slot 94 in the yoke 86 abuts the motor shaft 62. The yoke 86 rotates with the motor shaft 62 so that the engagement, once made, is non-frictional. The one edge of the slot 94 and the shaft 62 acts as a detent to hold the magnetron 50 to rotate with a trace defined on the outside by the first diameter 92. Alternatively, blocks may be mounted on the yoke 86 to constrain the motion of the swing arm 96 and to determine the extent to which the magnetron 50 may pivot about the axis 100. After the magnetron 50 has been rotating for a long period in the water bath 68, the water begins to swirl with the magnetron 50, thereby decreasing the hydrodynamic force holding the magnetron 50 at the detent position. However, there is sufficient wall friction that some hydrodynamic force persists to gently hold the magnetron 50 at that position. The movement to the inner detent position is further promoted by accelerational forces that occur when the motor begin rotating the shaft 62. The inertia of the stationary plate 86 resists this acceleration causes the plate 86 to swing relative to the joint axis 100 to the illustrated position. Although hydrodynamic forces are preferred to provide the force determining which detent position is assumed, it is possible to rely upon centrifugal forces to accomplish the same result.

As mentioned previously, magnetron sputtering causes sputtered material to redeposit and build up on the target surface in an annular area just outside of an inner circular area that has fresh metal exposed during sputtering. This annular area of redeposited material is generally associated with the first diameter 92 that the magnetron 50 traces during deposition but may be inside or outside of it depending upon the sputtering conditions. A large portion of the redeposited material is removed, according to a practice of the invention, by periodically performing a cleaning cycle. Because the cleaning process sputters redeposited material of uncertain composition and crystallinity and is likely to eject larger particles, the sputtered redeposited material should not be deposited on a production wafer. That is, the cleaning should be performed with no production wafer in the chamber. However, the pedestal 20 may be deleteriously sputter coated during the cleaning process causing a buildup of unwanted material on the wafer support area of the pedestal 20. Therefore, it is recommended that a dummy wafer be placed on the pedestal 20 during the cleaning cycle.

Figure 6:
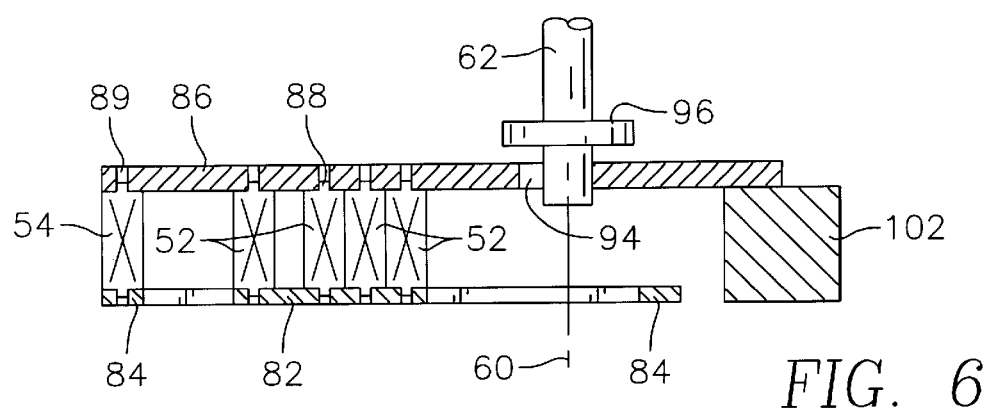
FIG. 6 is a cross-sectional view of the dual-diameter magnetron of FIG. 5 taken along view line 6—6.
Figure 5:
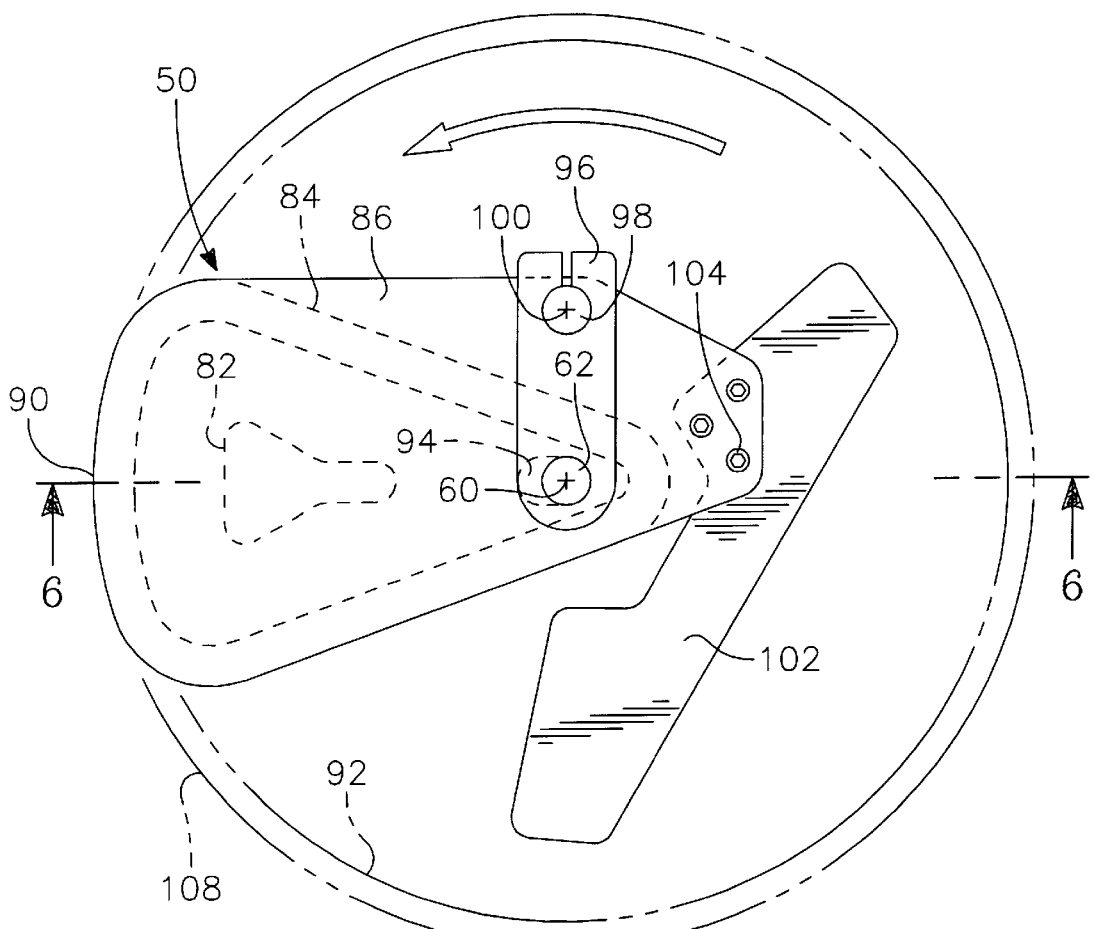
FIG. 5 is a plan view of the dual-diameter magnetron of FIG. 4 in the cleaning position.

In the cleaning cycle, the controller 48 causes the motor 64 to rotate in the opposite direction. As illustrated in the plan view of FIG. 5 and the cross-sectional view of FIG. 6 taken along view line 6—6 of FIG. 5, during the cleaning cycle, the magnetron 50 and counterweight 102 are rotated in the counter-clockwise direction. The water bath 68 now produces a clockwise force on the magnetron 50, which causes the yoke 86 and attached magnetron 50 to swing clockwise direction with respect to the pivot center 100 until the counterclockwise (right) side of the slot 94 in the yoke 94 encounters the motor shaft 62. Added to this force, the deceleration from the clockwise rotation of FIG. 4 and the acceleration to the counter-clockwise rotation of FIG. 5 further promotes the rotation of the plate 86 relative to the pivot center 100. The second side of the slot 94 and the motor shaft 62 act as a second detent holding the magnetron 50 at a radial position such that the magnetron outer edge 88 traces a second circle 108 having a second diameter. The second diameter may be about 370 mm. As mentioned previously, blocks mounted to the yoke 86 may alternatively serve as the detents.

With the magnetron now rotating at the enlarged outer diameter, the DC magnetron sputter reactor is operated to sputter the target. The extra 10 mm of radius is sputtered and cleaned in the area likely to be heavily redeposited during the normal deposition cycles. The annular area corresponding to the extra 10 mm may be either inside or outside of the annulus between the two diameters 92, 108 depending on the relationship between the area of fresh target and the magnetron track. While it is true that during cleaning some sputtered material is redeposited even further outside, the cleaning is performed much less frequently than is production deposition and the cleaning is performed without a production wafer present in the chamber. As a result, the outer redeposition is not likely to cause particulate problems during the finite lifetime of the target.

The sputtering conditions during cleaning may be the same as during production deposition or they may be changed to reflect the need to clean rather than to deposit uniform, high-quality films. Higher powers may be used to break through a nitride layer. In a chamber used for reactive sputtering, for example, of TiN or TaN, there is no need to supply the nitrogen during cleaning. Only the argon working gas may be supplied. The cleaning should continue for sufficient time to remove the redeposited material and to leave exposed fresh target material.

Although the reversible rotation mechanism described above simply achieves the desired change of sputtering diameter, other types of eccentric mechanisms 80 may be used in the reactor of FIG. 1 to achieve much the same effect. These mechanisms include mechanical, electrical, and fluid and other pneumatic actuators interposed between the rotation shaft 62 and the magnetron 50 with control lines easily accommodated within the rotation shaft 62. Alternatively, the outer detent position may be actively controlled within the reversible rotational mechanism described above. Such actively controlled mechanisms have the further advantage of allowing the magnetron sweep to be controlled to more than two diameters. An advantage of the rotationally induced eccentricity of the described embodiment is that it requires no further control beyond the controller 48 issuing the reversible rotation commands to the motor 64.

Although the dual-diameter magnetron described above was used in a DC magnetron sputter reactors relying only on capacitive coupling, the magnetron of the invention is not so limited. A variable diameter rotatable magnetron can be advantageously used in RF sputtering and in sputter reactors relying upon auxiliary plasma sources, such as an inductively coupled high-density plasma sputter reactor.

The invention thus provides for a significant reduction in the production of particulates with only minor changes in structure and operation.

What is claimed is:

1. A magnetron sputtering apparatus, comprising:
   a plasma sputtering chamber adapted to include a target in opposition to a support capable of holding a substrate to be sputter coated;
   a motor coupled to a shaft rotatable about a center of said target;
   a magnetron including opposed magnetic poles positioned on a side of said target opposite said support; and
   an eccentric mechanism coupling said magnetron to said shaft to vary a diameter of rotation of said magnetron about said center of said target between a plurality of discrete diameters invariant for a complete rotation of said magnetron about said center.

2. The magnetron sputtering apparatus of claim 1, wherein said eccentric mechanism includes an actively controlled actuator.

3. The magnetron sputtering apparatus of claim 1, wherein said plurality of discrete diameters consist of two discrete diameters.

4. A magnetron sputtering apparatus, comprising:
   a plasma sputtering chamber adapted to include a target in opposition to a support capable of holding a substrate to be sputter coated;
   a motor coupled to a shaft rotatable about a center of said target;
   a magnetron including opposed magnetic poles positioned on a side of said target opposite said support; and
   an eccentric mechanism coupling said magnetron to said shaft to vary a diameter of rotation of said magnetron about said center of said target, wherein said eccentric mechanism causes said diameter of rotation to vary between first and second values between reversed rotations of said shaft.

5. The magnetron sputtering apparatus of claim 4, wherein said eccentric mechanism includes:
   an arm fixed on a first end to said shaft and extending in a direction offset from an axis of said shaft; and
   a joint having a first pivot part fixed to a second end of said arm and a second pivot part fixed to said magnetron.

6. The magnetron sputtering apparatus of claim 4, further comprising a liquid bath in which said magnetron rotates and wherein hydrodynamic force between said magnetron and said liquid bath causes said diameter of rotation to vary between said first and second values.

7. The magnetron sputtering apparatus of claim 5, further including two detents limiting an amount of pivoting of said magnetron about said joint in first and second pivoting directions.

8. A rotatable magnetron for use in a magnetron sputter reactor, comprising:

first and second poles of opposed magnetic polarity fixed to a support plate and extending along a plane perpendicular to a first axis;

a rotation shaft extending along a second axis parallel to said first axis; and an eccentric mechanism coupling said support plate and said rotation shaft and providing a variable offset between said first and second axes, said variable offset being selectable between a plurality of discrete offsets;

whereby said magnetron is rotatable with variable diameters corresponding to said variable offset.

9. The magnetron of claim 7, wherein said eccentric mechanism includes a pivot extending about a third axis offset from said second axis.

10. The magnetron of claim 8, wherein said eccentric mechanism includes two detents limiting rotation in first and second directions of said support plate about said third axis.

11. The magnetron of claim 8, wherein a rotation of said magnetron in a first direction in a liquid bath exerts a force on said magnetron opposite said first direction, a selected direction of rotation controlling said variable offset to a selected one of two offsets.

12. The magnetron of claim 8, wherein a value of said selectable variable offset is maintained during a complete rotation of said rotation shaft.

13. A sputtering process, comprising the steps of:

(a) rotating a magnetron about a center of a sputtering target on a backside thereof, said target forming a side of a plasma sputtering chamber;

(b) plasma sputtering said target;

(c) a deposition operation including steps (a) and (b) and further causing said magnetron to rotate about a track having a first diameter about said center; and (d) a cleaning operation including steps (a) and (b) and further causing said magnetron to rotate along a track having a second diameter about said center larger than said first diameter.

14. The process of claim 13, wherein a difference between steps (c) and (d) is a direction of rotation of step (a).

15. The process of claim 13, wherein a production wafer is placed in said chamber during step (c) to be coated by said plasma sputtering and a dummy wafer is placed in said chamber during step (d).

16. A magnetron sputter reactor, comprising:

a plasma sputtering chamber adapted to include a target in opposition to a support capable of holding a substrate to be sputter coated;

a motor shaft rotatable about a center of said target;

a magnetron including opposed magnetic poles positioned on a side of said target opposite said support; and a coupling fixed on a first end to said motor shaft and fixed on a second end to said magnetron and having a selectable position with respect to the center and parallel to said first and second ends that is maintained constant during a complete rotation of said motor shaft.

17. The sputter reactor of claim 16, wherein said selectable position is selected from a plurality of discrete positions.

18. The sputter reactor of claim 17, wherein said plurality of discrete positions consist of two discrete positions.

19. The sputter reactor of claim 16, wherein selectable position controls a rotation diameter of said magnetron about said center of said target.

* * * * *